(12) United States Patent
Coolbaugh et al.

(10) Patent No.: US 7,170,181 B2
(45) Date of Patent: Jan. 30, 2007

(54) OPTIMUM PADSET FOR WIRE BONDING RF TECHNOLOGIES WITH HIGH-Q INDUCTORS

(75) Inventors: Douglas D. Coolbaugh, Essex Junction, VT (US); Zhong-Xiang He, Essex Junction, VT (US); Wolfgang Sauter, Richmond, VT (US); Barbara A. Waterhouse, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 10/707,064

(22) Filed: Nov. 19, 2003

(65) Prior Publication Data

US 2005/0104188 A1 May 19, 2005

(51) Int. Cl.
*H01L 23/48* (2006.01)
*H01L 23/52* (2006.01)
*H01L 29/40* (2006.01)

(52) U.S. Cl. .............................. 257/775; 257/E21.022
(58) Field of Classification Search ................ 257/775; 336/200
See application file for complete search history.

(56) References Cited

U.S. PATENT DOCUMENTS

| | | | |
|---|---|---|---|
| 4,845,543 A | | 7/1989 | Okikawa et al. |
| 5,139,192 A | | 8/1992 | Simmonds |
| 5,450,263 A | * | 9/1995 | Desaigoudar et al. ....... 360/110 |
| 5,529,831 A | * | 6/1996 | Waga et al. ................ 428/209 |
| 5,773,899 A | | 6/1998 | Zambrano |
| 5,874,770 A | * | 2/1999 | Saia et al. .................. 257/536 |
| 5,884,835 A | | 3/1999 | Kajiwara et al. |
| 6,025,995 A | * | 2/2000 | Marcinkiewicz ............ 361/760 |
| 6,027,999 A | * | 2/2000 | Wong ......................... 438/637 |
| 6,077,766 A | | 6/2000 | Sebesta et al. |
| 6,218,728 B1 | | 4/2001 | Kimura |
| 6,306,750 B1 | | 10/2001 | Huang et al. |
| 6,323,096 B1 | * | 11/2001 | Saia et al. .................. 438/384 |
| 6,437,418 B1 | * | 8/2002 | Ferrari et al. ............... 257/531 |
| 6,903,644 B2 | * | 6/2005 | Wang et al. ................ 336/200 |

(Continued)

OTHER PUBLICATIONS

S.G. Bombardier, et al. (1997) "Aluminum-Tungsten-Aluminum Sandwich for Semiconductor Chip Wirebond Pad", IBM Technical Disclosure Bulletin, vol. 40, No. 6, p. 131.

(Continued)

*Primary Examiner*—Evan Pert
*Assistant Examiner*—Benjamin P. Sandvik
(74) *Attorney, Agent, or Firm*—Scully, Scott, Murphy & Presser, P.C.; William D. Sabo, Esq.

(57) ABSTRACT

An RF structure that includes an optimum padset for wire bonding and a high performance inductor that contains relatively thick metal inductor wires, both of which are located atop the final interconnect level of an interconnect structure. Specifically, the RF structure includes a dielectric layer having metal inductor wires of a first thickness and a metal bond pad having a major area of a second thickness located on a surface thereof, wherein the first thickness is greater than the second thickness. In the inventive RF structure, the majority of the metal bond pad is thinned for wire bonding, while maintaining the full metal wire thickness in the other areas of the structure for inductor performance requirements, such as, for example, low resistivity. Methods for fabricating the aforementioned RF structure are also provided.

9 Claims, 4 Drawing Sheets

U.S. PATENT DOCUMENTS

2003/0076209 A1* 4/2003 Tsai et al. .................. 336/200

OTHER PUBLICATIONS

C.R. Fedorko, Jr., et al. (1984) "Packaging Substrate with Top Surface Metallurgy Adapted for Mixed Technology Device Bonding and Method", IBM Technical Disclosure Bulletin, vol. 26, No. 12, p. 6624.

D. Chance, et al. (1993) "Thin Film Metallurgical Structure and Wire for Engineering Chance", IBM Technical Disclosure Bulletin, vol. 36, No. 1, p. 41.

T.H. Chiles (1989) Abstract of Disclosure No. 30581 entitled "Use of a Composite Metal Pad for Wirebond connection to the Copper Core of a Metal Core Substrate Circuit Board" Kenneth Mason Publications, Ltd. England, No. 305 (1 page); and.

R. J. Bergeron, et al. (1992) Abstract of Disclosure No. 34237 entitled "Bond Pad Metallurgy for Wire Bonding", Kenneth Mason Publications, Ltd. England, No. 342 (1 page).

* cited by examiner

OPTIMUM PADSET FOR WIRE BONDING RF TECHNOLOGIES WITH HIGH-Q INDUCTORS

BACKGROUND OF INVENTION

1. Field of the Invention

The present invention relates to a radio frequency (RF) structure, and more particularly to an RF structure that comprises an optimum padset for wire bonding and a high performance inductor that includes relatively thick metal inductor wires, both of which are located atop the final interconnect level of an interconnect structure. The present invention also provides methods for fabricating such an RF structure.

2. Background of the Invention

In the semiconductor industry, digital and analog circuits, including complex microprocessors and operational amplifiers, have been successfully implemented in silicon-based integrated circuits (ICs). Such Si-based ICs typically include active devices such as, for example, bipolar transistors and field effect transistors (FETs), diodes, and passive devices, including resistors, capacitors, and inductors.

Attempts to miniaturize radio frequency (RF) circuits, however, remain a challenge. RF circuits are generally employed in cellular phones, wireless modems, PDAs, and other types of communication equipment. The miniaturization problem is a result of the difficulty in producing a good inductor in silicon technologies which is suitable for RF applications at widely used microwave frequencies from 900 MHz to 2.4 GHz.

Monolithic microwave integrated circuits (MMICs), which are rapidly outpacing discrete ICs in mobile wireless communication products, require high-Q (quality factor) passive components, such as inductors and capacitors, to be able to realize integrated filters and matching sections with small insertion losses.

The typical design of high performance semiconductor components for use in RF technologies generally employs a thick aluminum metal wire since the performance of inductors is closely related to the resistance of the metal wire, e.g., high metal resistance typically leads to slow inductors.

On the other hand, bonding between a gold wire and aluminum bond pads degrades significantly for thicker aluminum bond pads. With thicker aluminum bond pads, more aluminum atoms tend to diffuse into the gold wire leads causing the formation of voids (intermetallic formation) resulting in poor wire bond reliability. As an example, the lifetime specification using a high temperature ball shear reliability test standard of a gold wire bond to a 4 μm thick aluminum pad was granted (lowered) to 100 hours at 200° C. during SiGe dual metal technology qualification; compared to a normal wire bond standard of 200 hours at 200° C.

FIG. 1 illustrates a typical prior art RF structure 10 formed on a final insulating layer 12 of an interconnect structure (not specifically shown). The prior art RF structure 10 includes thick aluminum inductor wires 14 for high performance, high quality factor (Q) inductors and a thick aluminum bond pad 16.

In view of the current state of the art, there is a need for providing a new RF structure and methods for fabricating the same that resolve the aluminum to gold wire bonding reliability issues for high performance RF technologies.

SUMMARY OF INVENTION

The present invention provides a solution to meet wire bond reliability requirements without sacrificing RF performance for high-Q inductors. Specifically, the present invention provides an RF structure that comprises an optimum padset for wire bonding and a high performance inductor that includes relatively thick metal inductor wires, both of which are located atop the final interconnect level of an interconnect structure.

The term "high performance" is used in the present application to denote an inductor that has a high Q factor that is on the order of about 25 or above, a low inductance that is on the order of about 1 nH or less, and a metal sheet resistance of less than 7 mOhms/square.

In broad terms, the RF structure of the present invention comprises:

a dielectric layer having metal inductor wires of a first thickness and a metal bond pad having a major area of a second thickness located on a surface thereof, wherein said first thickness is greater than said second thickness.

In the inventive RF structure, the majority of the metal bond pad is thinned for wire bonding, while maintaining the full metal wire thickness in the other areas of the structure for inductor performance requirements, such as, for example, low resistivity.

The present invention also relates to various methods of forming the above-mentioned RF structure. Specifically, and in broad terms, each of the methods of the present invention comprises:

forming a metal layer on a surface of a dielectric layer; and patterning said metal layer so as to form metal inductor wires of a first thickness and a metal bond pad having a major area of a second thickness located on a surface of said dielectric material, wherein said first thickness is greater than said second thickness.

The broad method of the present invention can be divided into three different integration processes. The three integration processes that are included within the broad method mentioned above include (1) a process including a wire bond pad recess etch post metal wire/inductor formation; (2) a process including metal wire/inductor formation post wire bond recess etching; and (3) a process including wire bond pad recess etching utilizing a passivation layer as an etch mask.

The present invention advantageously provides:

50% longer wire bonding lifetimes at high temperatures;

the ability to meet and exceed industry reliability standards; and the ability to retain high performance inductors.

DETAILED DESCRIPTION

Figure 1:
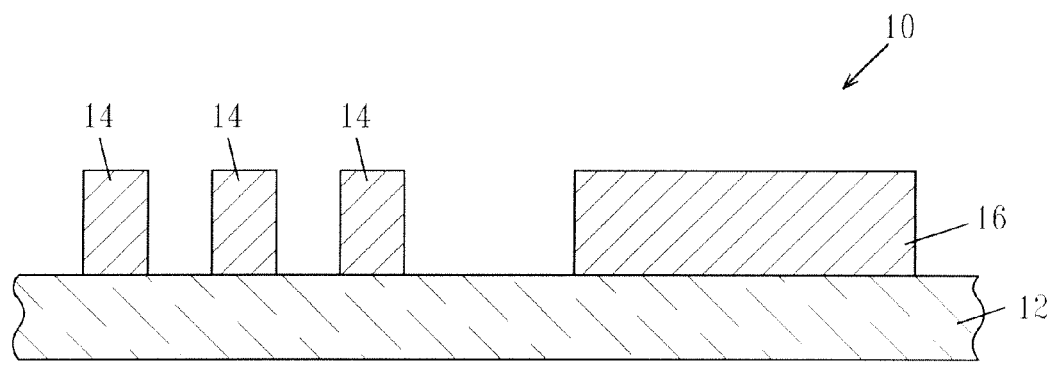
FIG. 1 is a pictorial representation (through a cross sectional view) illustrating a prior art RF structure that includes thick metal inductor wires and a thick bond pad for wiring bonding.

The present invention, which provides a semiconductor structure having an optimized padset for wiring bonding in RF technologies integrated with a high performance inductor as well as methods for forming the same, will now be described in greater detail by referring to the drawings that accompany the present application. It is noted that the drawings accompanying the present application are not drawn to scale therefore the invention should not be limited to the dimensions illustrated in the drawings.

In one aspect of the present invention, a structure is provided that resolves the metal bond pad to metal wiring bonding reliability issues for high performance RF technologies that utilize the common final thick metal level of an interconnect structure. It is noted that the term "pad-set" is used in the present invention to describe both the metal bond pad and the metal wiring that is attached thereto.

Figure 2:
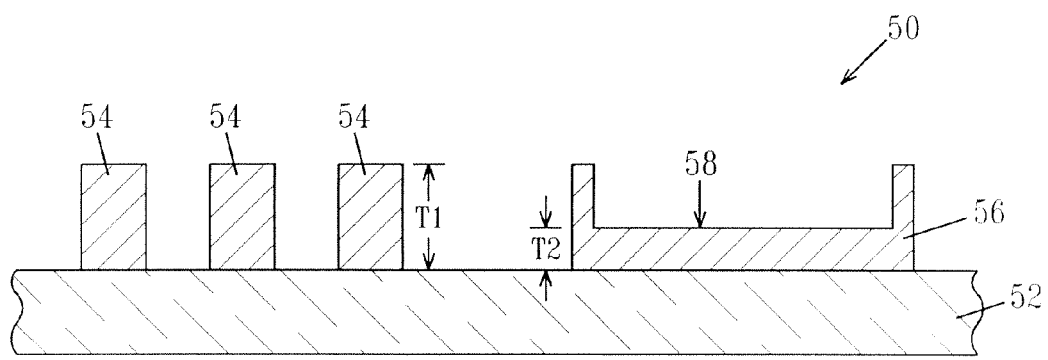
FIG. 2 is a pictorial representation (through a cross sectional view) illustrating the RF structure of the present invention that includes metal inductor wires of a first thickness and a metal bond pad having a major area of a second thickness located on a surface of a dielectric layer, wherein said first thickness is greater than said second thickness.

FIG. 2 shows the structure of the present invention that meets semiconductor wire bond reliability specification requirements without sacrificing RF performance for high Q inductors. Specifically, the RF structure 50 shown in FIG. 2 comprises a dielectric layer 52 having metal inductor wires 54 of a first thickness T1 and a metal bond pad 56 having a major area 58 of a second thickness T2 located on a surface of the dielectric layer 52.

In accordance with the present invention, the first thickness T1 is greater than the second thickness T2, therefore, the inventive structure has an inductor composed of metal inductor wires 54 having high performance and an optimized padset (including the thinned metal bond pad 56) for use in wiring bonding with a conductive metal wire (not shown).

Typically, the first thickness T1 of the metal inductor wires is from about 2000 to about 5000 nm, with a first thickness T1 from about 3000 to about 4000 nm being more typical. The second thickness T2 of the metal bond pad 56 is typically from about 500 to about 1500 nm, with a second thickness T2 from about 750 to about 1500 nm being more typical. The thickness ranges for T1 and T2 provide optimal thicknesses for the metal inductor wires 54 and the metal bond pad 56 utilized in the present invention.

The conductive metal wire employed in the present invention for bonding with the metal bond pad 56 includes any conductive metal that is typically used in wiring bonding applications. Illustrative examples, of conductive metal wires employed in the present invention, include, but are note limited to: Au, Al, Cu. Of these various conductive metals, it is preferred that the conductive wire be composed of Au.

In the structure shown in FIG. 2, the metal inductor wires 54 and the metal bond pad 56 are composed of the same low resistivity conductive material. The term "low resistivity" when used in connection with the metal layer of the inductor and the metal bond pad denotes a conductive material whose resistivity is about 3 micro-ohms*cmor less. Illustrative examples of low resistivity conductive materials include, but are not limited to: Cu, Al, Pt, Ag, Au, and alloys thereof. In one embodiment of the present invention, the metal inductor wires 54 and the metal bond pad 56 are comprised of Al, while the wire bond (not shown) is comprised of Au.

Dielectric layer 52, which represents the final interconnect level of an interconnect structure, includes any inorganic or organic dielectric material. The dielectric layer 52 can be porous or non-porous and may have a low dielectric constant (less than 4.0) or a high dielectric constant (4.0 or greater). Illustrative examples of dielectric materials that can be used as layer 52 include, but are not limited to: oxides, such as $SiO_2$, $Al_2O_3$, $HfO_2$, $ZrO_2$, and perovskite oxides; nitrides; oxynitrides; polyimides; polyimines; Si-containing polymers; or low-k dielectric constant materials such as SILK. The dielectric layer 52 may include metal wires and vias (not specifically shown) therein.

In the structure shown in FIG. 2, the thickness T2 of the metal bond pad 56 has been optimized for wire bonding, yet the thickness T1 of the metal inductor wires 54 has been optimized for providing a high performance inductor. This is unlike the RF structure shown in FIG. 1 wherein the bond pad and the metal inductor wires are both relatively thick. In some embodiments of the present invention, which are illustrated in the drawings, edge portions of the metal bond pad 56 have a thickness equal to T1 since the same have not been subjected to a thinning step. The major area 58 of the metal bond pad 56 however has been thinned to a thickness T2 that is less than T1. By major area 58 it is meant that a majority portion of metal bond pad 56 has been thinned from T1 to T2.

It should be noted that although the drawings and description illustrate the presence of a single metal bond pad and a single set of metal inductor wires, the inventive structure shown in FIG. 2 could contain a plurality of bond pads and various sets of metal inductor wires across the entire surface of dielectric layer 52.

The RF structure shown in FIG. 2 is formed utilizing a method in which the metal bond pad is selectively thinned, yet the metal inductor wires are maintained thick to ensure the fabrication of a high performance inductor. The present invention also relates to various methods of forming the above-mentioned RF structure. Specifically, and in broad terms, the RF structure shown in FIG. 2 can be formed by first forming a metal layer on a surface of a dielectric material; and then patterning the metal layer so as to form metal inductor wires of a first thickness and a metal bond pad having a major area of a second thickness located on a surface of the dielectric material, wherein the first thickness is greater than the second thickness.

The broad method of the present invention can be divided into three different integration processes. The three integration processes that are included within the broad method mentioned above include (1) a process including a wire bond pad recess etch post metal wire/inductor formation which is shown, for example, in FIGS. 3A–3D; (2) a process including metal wire/inductor formation post wire bond recess etching which is shown, for example, in FIGS. 4A–4C; and (3) a process including wire bond pad recess etching utilizing a passivation layer as an etch mask which is shown, for example, in FIGS. 5A–5B. The process details of each of the three integration processes that can be used in fabricating the RF structure shown in FIG. 2 will now be further described.

The processing scheme set forth in FIGS. 3A–3D is first described in more detail. The processing scheme illustrated in FIGS. 3A–3D represents a first embodiment of the present invention in which the RF structure shown in FIG. 2 can be fabricated. Specifically, the processing scheme of the first embodiment of the present invention begins with providing an initial structure 100 that is shown, for example, in FIG.

3A. The initial structure 100 comprises a dielectric layer 52 and a metal layer 51 located on a surface of the dielectric layer 52.

As stated above, the dielectric layer 52 represents a final interconnect level of an interconnect structure. The dielectric layer 52 includes any inorganic or organic dielectric material. The dielectric layer 52 can be porous or non-porous and may have a low dielectric constant (less than 4.0) or a high dielectric constant (4.0 or greater). Illustrative examples of dielectric materials that can be used as layer 52 include, but are not limited to: oxides, such as $SiO_2$, $Al_2O_3$, $HfO_2$, $ZrO_2$, and perovskite oxides; nitrides; oxynitrides; polyimides; polyimines; Si-containing polymers; or low-k dielectric constant materials such as SILK. The dielectric layer 52 may include metal wires and vias (not specifically shown) therein. In some preferred embodiments, the dielectric layer 52 is a low k dielectric material such as a Si-containing material.

The dielectric layer 52 is typically formed as a component of an interconnect structure by depositing the dielectric layer 52 atop the interconnect structure. Suitable deposition process that can be used in forming the dielectric layer 52 include, but are not limited to: chemical vapor deposition (CVD), plasma-assisted CVD, evaporation, spin-on coating and other like deposition processes.

The thickness of the dielectric layer 52 may vary depending on the dielectric material used as well as the process in which it has been deposited. Typically, the dielectric layer 52 has a thickness from about 1000 to about 5000 nm, with a thickness from about 3000 to about 4000 nm being more typical.

The metal layer 51 is formed atop the dielectric layer 52 utilizing a conventional deposition process including, for example, CVD, plasma-assisted CVD, sputtering, plating, chemical solution deposition, atomic layer deposition, physical vapor deposition and other like deposition process. The thickness of the metal layer 51 after deposition is typically from about 2000 to about 5000 nm, with a thickness of from about 3000 to about 4000 nm being more typical.

The metal layer 51, which is employed in forming the metal inductor wires 54 and the metal bond pad 56, is composed of a low resistivity conductive material. The term "low resistivity" when used in connection with the metal layer 51 denotes a conductive material whose resistivity is about 3 micro-ohms*cmor less. Illustrative examples of low resistivity conductive materials that can be employed as the metal layer 51 include, but are not limited to: Cu, Al, Pt, Ag, Au, and alloys thereof. In one embodiment of the present invention, the metal layer 51 is comprised of Al.

Figure 3A:
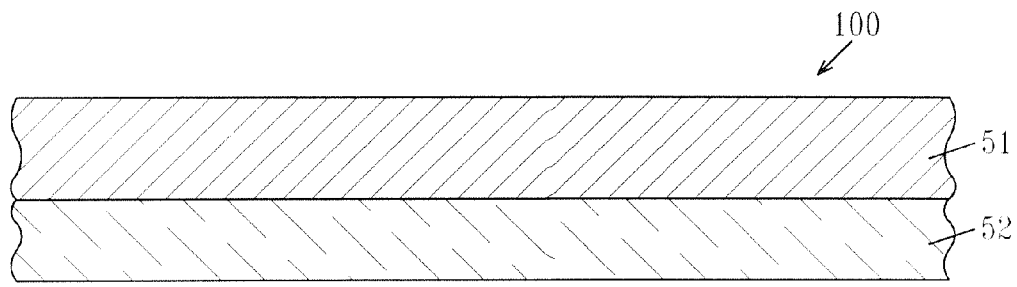
FIGS. 3A–3D are pictorial representations (through cross sectional views) showing the basic processing steps employed in a first embodiment of the present invention.
Figure 3B:
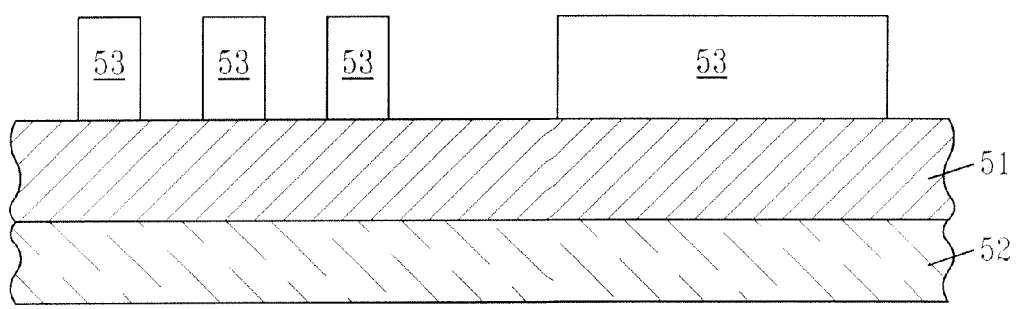

After deposition of the metal layer 51, the metal layer 51 is patterned by lithography and etching. These steps of the first embodiment of the present invention are illustrated in FIGS. 3B (structure including inductor wire photolithographic patterning) and 3C (patterned metal layer-containing structure). The lithography step includes forming a photoresist 53 on top of the metal layer 51 by utilizing a conventional deposition process such as, for example, spin-on coating, evaporation, chemical vapor deposition, plasma-assisted chemical vapor deposition and the like. After photoresist application, the photoresist is exposed to a pattern of radiation and then the pattern is developed in the exposed photoresist utilizing a conventional resist developer. The patterned photoresist 53 protects portions of the metal layer 51, while leaving other portions of the metal layer 51 exposed.

Figure 3C:
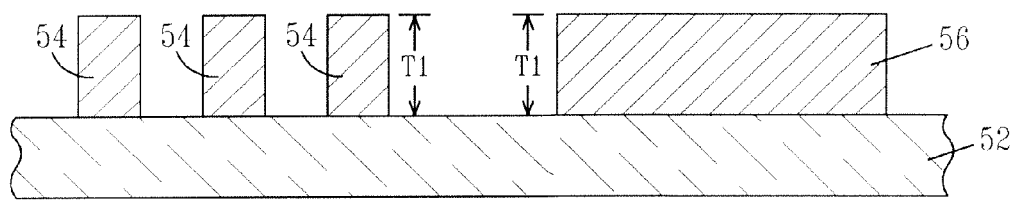

The exposed portions of the metal layer 51 are then removed by an etching process such as reactive ion plasma etching, wet chemical etching, laser ablation, or ion beam etching to provide the patterned metal layer-containing structure shown in FIG. 3C. As shown in FIG. 3C, the patterned metal layer-containing structure includes metal inductor wires 54 and metal bond pad 56. At this point of the present invention, the metal inductor wires 54 and the metal bond pad 56 have the same thickness, i.e., T1.

It is noted that following the etching step, the patterned photoresist 53 is removed from the structure utilizing a stripping process well known to those skilled in the art.

Figure 3D:
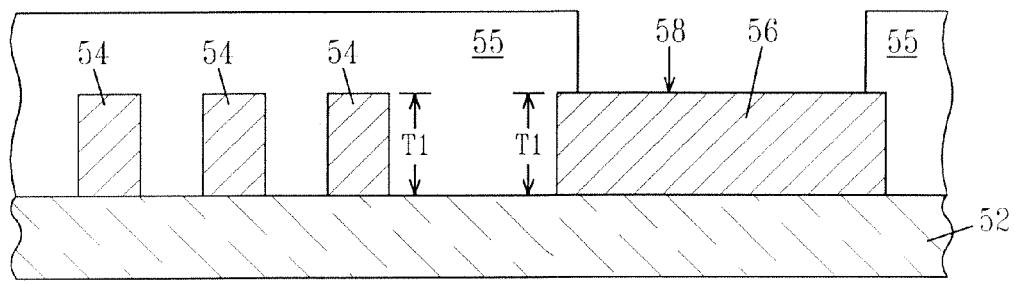

After forming the metal inductor wires 54 and metal bond pad 56 on top of the dielectric layer 52, the metal bond pad 56 is further patterned and thinned by lithography and etching to provide a patterned metal bond pad 56 having a second thickness T2 that is optimal for use in metal wire bonding applications. These steps of the first embodiment of the present invention are illustrated in FIG. 3D (structure including bond pad lithographic patterning) and FIG. 2 (structure including patterned and thinned metal bond pad). The lithography step includes forming a photoresist 55 on top of the structure shown in FIG. 3C by utilizing a conventional deposition process such as, for example, spin-on coating, evaporation, chemical vapor deposition, plasma-assisted chemical vapor deposition and the like. After photoresist application, the photoresist is exposed to a pattern of radiation and then the pattern is developed in the exposed photoresist utilizing a conventional resist developer. The patterned photoresist 55 at least protects the metal inductor wires 54, while leaving a major surface 58 of the metal bond pad 56 exposed. As shown in FIG. 3D, edges portions of the metal wire bond pad 54 may be protected by the patterned photoresist 55.

The exposed major surface 58 of the metal bond pad 56 is then recessed, i.e., thinned, by a timed etching process such as reactive ion plasma etching, wet chemical etching, laser ablation, or ion beam etching to provide the patterned and thinned metal bond pad 56 shown in FIG. 2. It is noted that following the etching step, the patterned photoresist 55 is removed from the structure utilizing a stripping process well known to those skilled in the art.

Figure 4A:
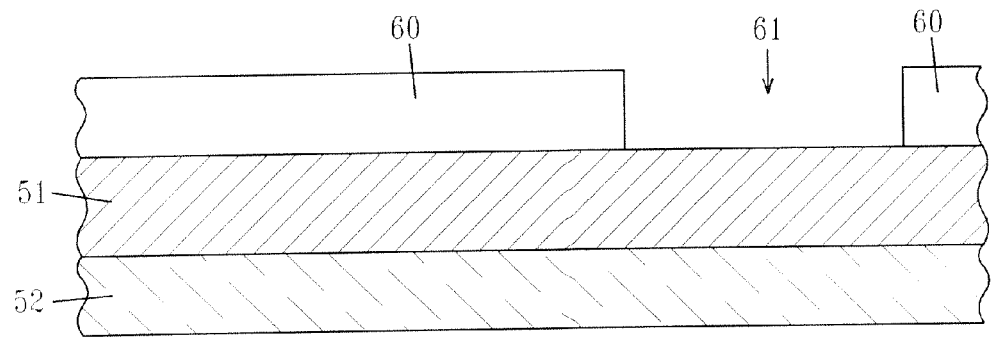
FIGS. 4A–4C are pictorial representations (through cross sectional views) showing the basic processing steps employed in a second embodiment of the present invention.
Figure 4B:
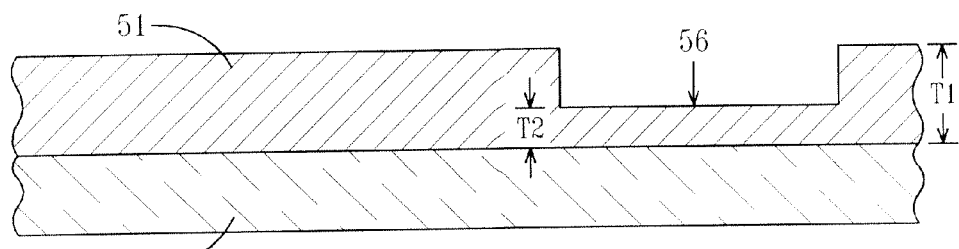
Figure 4C:
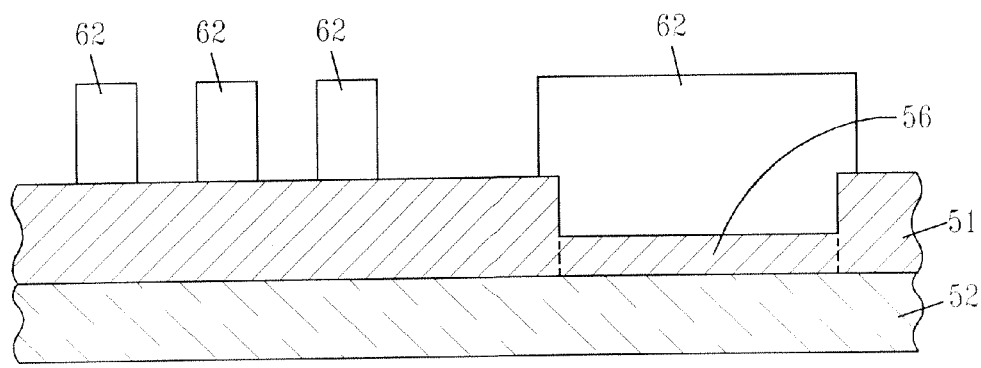

The processing scheme set forth in FIGS. 4A–4C will now be described in more detail. The processing scheme illustrated in FIGS. 4A–4C represents a second embodiment of the present invention in which the RF structure shown in FIG. 2 can be fabricated. Specifically, the processing scheme of the second embodiment of the present invention begins with providing an initial structure 100 that is shown in FIG. 3A. The initial structure 100 comprises a dielectric layer 52 and a metal layer 51 located on a surface of the dielectric layer 52. The materials and process details for this initial structure are the same as those described in the first embodiment of the present invention.

FIG. 4A shows the structure after patterned photoresist 60 is formed atop the initial structure 100. The patterned photoresist 60, which is used for wire bond pad photolithographic patterning, is formed utilizing the lithography process described above in the first embodiment of the present invention. As shown, the patterned photoresist 60 includes at least one opening 61 that exposed a portion of the metal layer 51.

Next, the exposed portion of the metal layer 51 is then recessed, i.e., thinned, by a timed etching process such as reactive ion plasma etching, wet chemical etching, laser ablation, or ion beam etching to provide the thinned metal bond pad 56 shown in FIG. 4B. It is noted that following the etching step, the patterned photoresist 60 is removed from the structure utilizing a stripping process well known to those skilled in the art. The resultant structure after thinning and removing the patterned photoresist 60 is shown in FIG. 4B.

FIG. 4C shows the next step of the present invention wherein another patterned photoresist 62, which is used for inductor/wire photolithographic patterning, is formed over the thinned wire bond pad 56 and portions of the metal layer 51. The structure is formed by utilizing another lithographic processing step. In this lithography step, the patterned photoresist 62 is formed such that the thinned bond pad 56 is protected from further etching as well as portions of the metal layer 51 in which the metal inductor wires 54 will be subsequently formed. The exposed portion of the metal layer 51 is then etched and thereafter the patterned photoresist 62 is removed to provide the RF structure shown in FIG. 2.

Figure 5A:
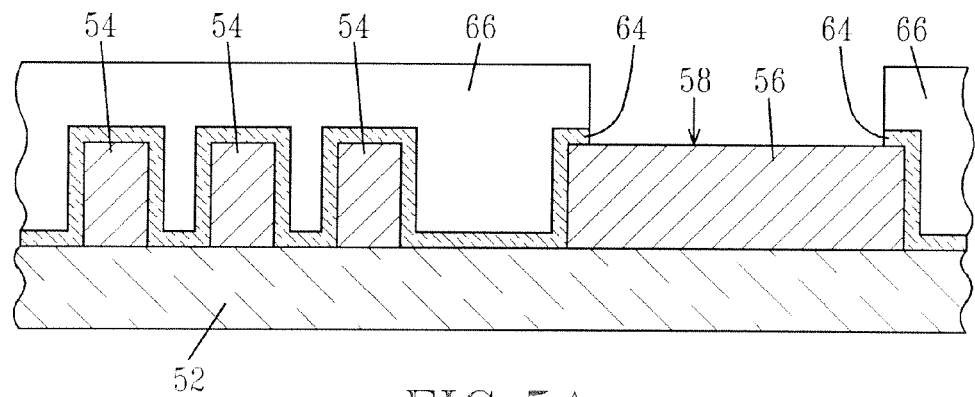
FIGS. 5A–5B are pictorial representations (through cross sectional views) showing the basic processing steps employed in a third embodiment of the present invention.
Figure 5B:
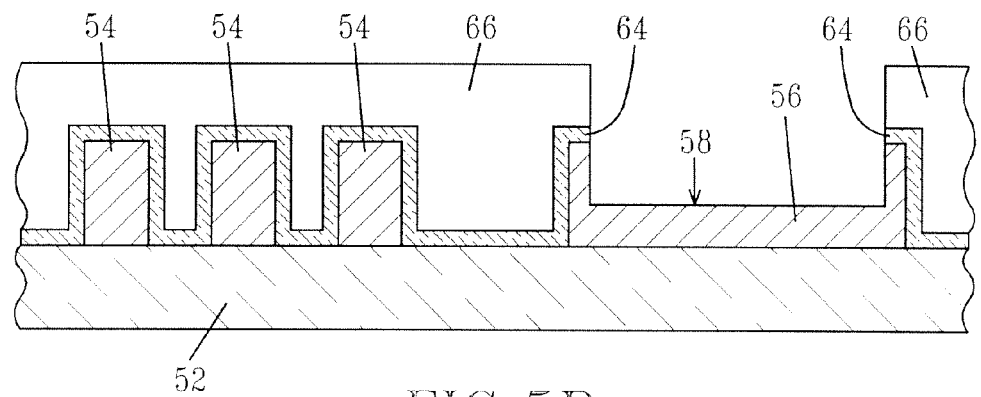

The processing scheme set forth in FIGS. 5A–5B will now be described in more detail. The processing scheme illustrated in FIGS. 5A–5B represents a third embodiment of the present invention in which the basic RF structure shown in FIG. 2 can be fabricated. In this embodiment however a passivation layer is present in the resultant RF structure. The passivation layer may remain in the structure or it may be ultimately removed after fabricating the optimal thickness of the metal inductor wires and the optimal thickness of the metal bond pad.

Specifically, the processing scheme of the third embodiment of the present invention begins with providing the structure shown in FIG. 3C. The materials and process details for this structure are the same as those described in the first embodiment of the present invention. FIG. 3C shows a structure including dielectric layer 50 and a patterned metal layer that include metal inductor wires 54 and metal bond pad 56.

A passivation layer 64 is then formed over the entire structure utilizing a conformal deposition process such as, for example, CVD or plasma-assisted CVD. Alternatively, passivation layer 64 may be formed by a thermal growth process such as oxidation, nitridation, oxynitridation or a combination thereof. The passivation layer 64 may comprise a single dielectric material or it may include a stack of dielectric materials. The passivation layer 64 may comprise an oxide, nitride, oxynitride or any combination thereof. The thickness of the passivation layer 64 may vary depending on the number of dielectric materials used as well as how those dielectric materials are formed. Typically, the passivation layer 64 has a thickness from about 600 to about 2000 nm.

After forming the passivation layer 64 over the entire structure, a patterned photoresist 66 having at least one opening overlying the metal bond pad 56 is provided utilizing a lithography step. The passivation layer 64 atop of the wire bond pad 56 not protected by the patterned photoresist 66 is then removed utilizing an etching process that selectively removes the passivation layer 64 as compared to either the patterned photoresist 66 or the conductive metal of the metal bond pad 56. The resultant structure formed after performing the above steps is shown, for example, in FIG. 5A. Note that the selective etching step stops atop the metal bond pad 56.

The exposed portion, which represent a major surface 58 of the metal wire bond 56, is then recessed, i.e., thinned, utilizing a timed etching process providing the structure illustrated in FIG. 5B. The remaining passivation layer 64 may be left on the structure or stripped so as to provide the RF structure shown in FIG. 2. Stripping of the passivation layer 64 is performed utilizing an etching process that selectively removes the passivation layer from the structure.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

The invention claimed is:

1. An RF structure comprising:
a dielectric material having metal inductor wires of a first thickness and a metal bond pad having a major area of a second thickness both of said metal inductor wires and said metal bond pad are located on an upper surface of said dielectric material, wherein said first thickness is greater than said second thickness and said dielectric material represents a final interconnect level of an interconnect structure.

2. The RF structure of claim 1 wherein the metal inductor wires and the metal bond pad are both composed of a conductive metal that has a resistivity of about 3 microohms*cmor less.

3. The RF structure of claim 2 wherein the conductive metal is selected from the group consisting of Cu, Al, Pt, Ag, Au, and alloys thereof.

4. The RF structure of claim 1 wherein the metal inductor wires and the metal bond pad are both composed of Al.

5. The RF structure of claim 1 wherein the first thickness is from about 2000 to about 5000 nm.

6. The RF structure of claim 1 wherein the second thickness is from about 500 to about 1500 nm.

7. The RF structure of claim 1 wherein the dielectric layer is an insulator having a dielectric constant less than 4.0 or an insulator having a dielectric constant of about 4.0 or greater.

8. The RE structure of claim 1 wherein the dielectric material is selected from oxides nitrides, oxynitrides, polyimides, polyimines and Si-containing polymers.

9. The RF structure of claim 1 further comprising a passivation layer located on exposed walls of said metal wire inductor and portions of said metal bond pad.

* * * * *